United States Patent
Haridass et al.

(10) Patent No.: US 7,503,111 B2
(45) Date of Patent: Mar. 17, 2009

(54) METHOD FOR INCREASING WIRING CHANNELS/DENSITY UNDER DENSE VIA FIELDS

(75) Inventors: Anand Haridass, Austin, TX (US); Dierk Kaller, Schoenaich (DE); Erich Klink, Schoenaich (DE); Gisbert Gerhard Thomke, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 411 days.

(21) Appl. No.: 11/095,741

(22) Filed: Mar. 31, 2005

(65) Prior Publication Data

US 2006/0219427 A1 Oct. 5, 2006

(51) Int. Cl.
*H05K 3/02* (2006.01)
(52) U.S. Cl. .......................................... 29/847; 174/254
(58) Field of Classification Search .................. 29/847; 174/254
See application file for complete search history.

(56) References Cited

U.S. PATENT DOCUMENTS

| | | | |
|---|---|---|---|
| 4,017,968 A | 4/1977 | Weglin | 29/625 |
| 4,319,708 A | 3/1982 | Lomerson | 228/111 |
| 4,704,791 A | 11/1987 | Chellis et al. | 29/852 |
| 5,450,290 A | 9/1995 | Boyko et al. | 361/792 |
| 5,451,722 A | 9/1995 | Gregoire | 174/261 |
| 5,487,218 A | 1/1996 | Bhatt et al. | 29/852 |
| 5,557,844 A | 9/1996 | Bhatt et al. | 29/852 |
| 5,571,593 A | 11/1996 | Arldt et al. | 428/131 |
| 5,662,987 A | 9/1997 | Mizumoto et al. | 428/209 |
| 6,609,296 B1 | 8/2003 | Farquhar et al. | 29/852 |
| 7,153,723 B1 * | 12/2006 | Medeiros | 438/106 |

* cited by examiner

*Primary Examiner*—Jeremy C Norris
(74) *Attorney, Agent, or Firm*—Stephen J. Walder, Jr.; Casimer K. Salys

(57) ABSTRACT

A method for increasing the wiring channels/density under dense via fields of a circuit board are provided. With the method, the power/ground lines for the circuit board are designed to be provided in an orthogonal or diagonal pattern. The land grid array (LGA)/ball grid array (BGA) makes contact only on the surface pads of the printed circuit board with no plated through holes/vias underneath these surface pads. This opens up wiring channels, which previously used to be occupied by plated through holes and anti-pads, that can now be used for maximizing signal line wiring routing.

7 Claims, 4 Drawing Sheets

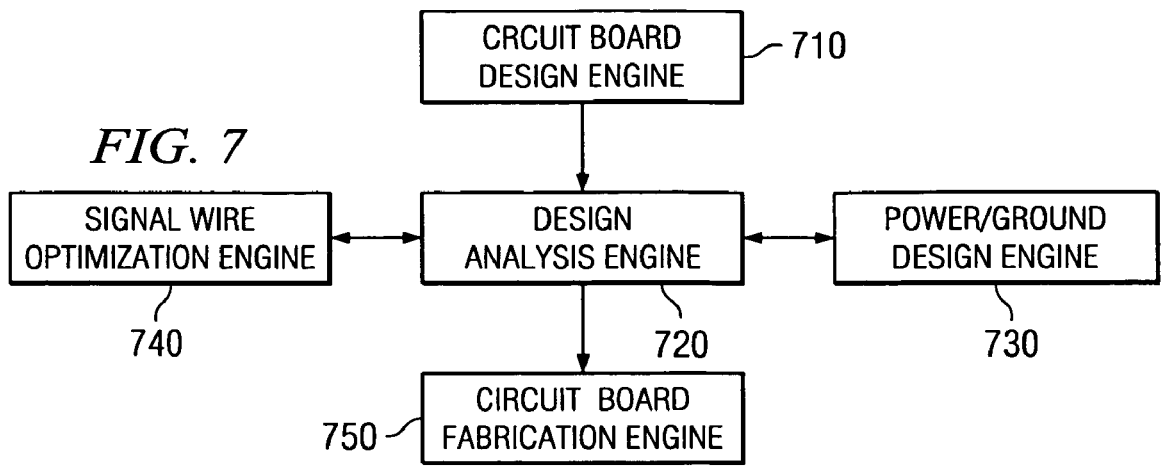
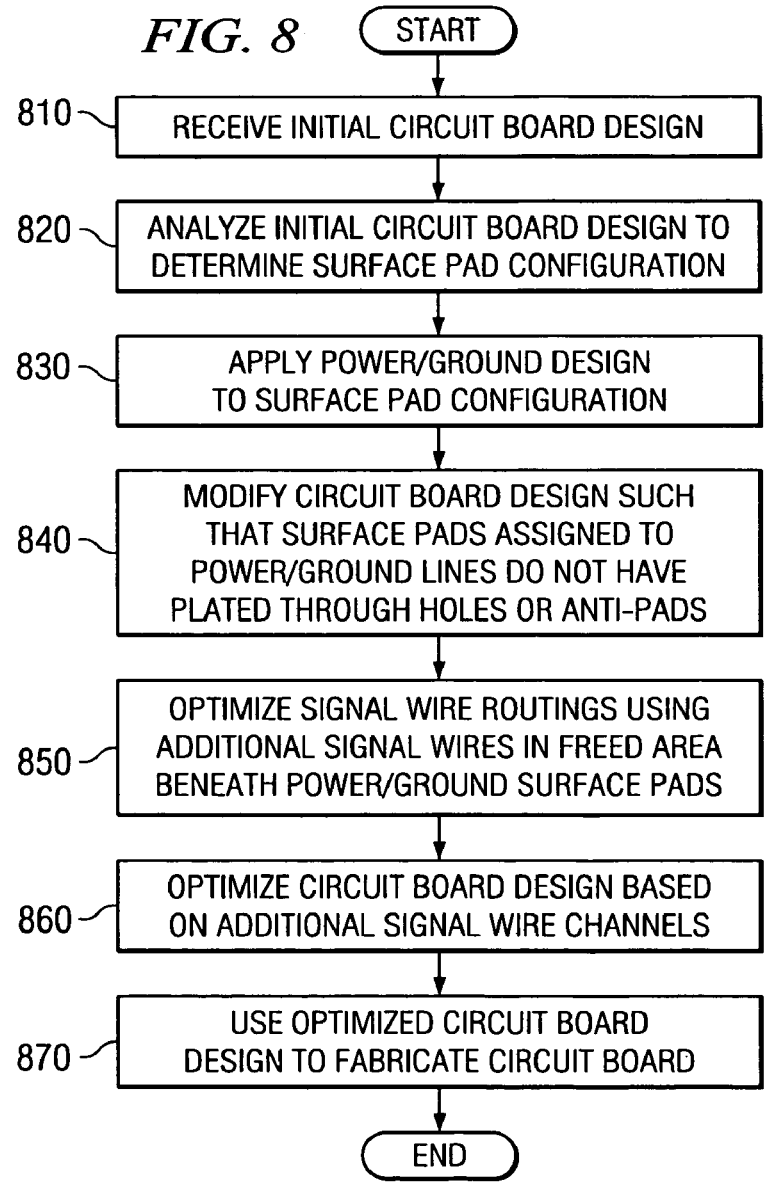

METHOD FOR INCREASING WIRING CHANNELS/DENSITY UNDER DENSE VIA FIELDS

BACKGROUND OF THE INVENTION

1. Technical Field

The present invention is generally directed to an improved integrated circuit design. More specifically, the present invention is directed to a system and method for increasing wiring channels/density under dense via fields of integrated circuits of a computer card.

2. Description of Related Art

Current printed circuit board constructions require one or more external conductive layers, e.g., circuitry and/or pads for mounting components thereon, and, given today's increased functional demands, a plurality of internal conductive planes, e.g., signal, power and/or ground. To provide effective interconnections between components and the board's conductive circuitry and pads, the use of through holes has been adopted wherein several such holes are passed through the board and electrically coupled in a selective manner to internal and external conductive elements. Such holes typically include a conductive, e.g., copper, layer as part thereof which in turn contacts the also typically copper circuitry and pads.

The term "through hole" or simply "hole" as used herein is meant to include both conductive and non-conductive apertures which may extend entirely through the circuit board or only partly there-through (such holes are often called "vias" in the art), including between two or more internal layers without being externally exposed. Examples of various circuit board structures which include the use of holes of these types and various methods of making such holes in circuit boards are defined in several published documents, including the following U.S. Letters patents, issued on the dates identified:

| | | |
|---|---|---|
| 4,017,968 | Weglin | Apr. 19, 1977 |
| 4,319,708 | Lomerson | Mar. 16, 1982 |
| 4,704,791 | Chellis et al | Nov. 10, 1987 |
| 5,450,290 | Boyko et al | Sep. 12, 1995 |
| 5,451,722 | Gregoire | Sep. 19, 1995 |
| 5,487,218 | Bhatt et al | Jan. 30, 1996 |
| 5,557,844 | Bhatt et al | Sep. 24, 1996 |
| 5,571,593 | Arldt et al | Nov. 5, 1996 |
| 5,662,987 | Mizumoto et al. | Sep. 2, 1997 |
| 6,609,296 | Farquhar et al. | Aug. 26, 2003 |

Printed circuit boards of the aforementioned type are particularly adapted for having one or more (usually several) electrical components, e.g., semiconductor chips, capacitors, resistors, etc., mounted on an external surface thereof and coupled to various, selected internal conductive planes within the board's dielectric substrate. As demands for increased levels of integration in semiconductor chips and other electrical components continue, parallel demands call for concurrent increased functional capabilities, e.g., increased circuit densities, in printed circuit boards adapted for use with such components. Such demands further emphasize the growing need for more closely spaced electrical components on the board's outer surfaces. For those boards possessing greater functional capabilities and therefore which use several through holes therein, it is highly desirable to position the electrical components directly over the holes to maximize board real estate while assuring a compact, miniaturized final board product.

For any circuit board, or card, that uses an area array package, or other dense via field, the cost of the printed circuit board is directly determined by the strategy for wiring escape and the number of layers that are needed for the escape. As improvements in circuit technologies require increased numbers of wiring channels and increased wiring densities in circuit boards, techniques for increasing the wiring channels/densities have been developed. In order to address wiring congestion issues on circuit boards, typical solutions involve adding additional layers to the circuit board thereby increasing the amount of wiring channels available. However, adding additional layers to the circuit board increases the base cost of the printed circuit board. Other solutions use thinner wiring to escape under the module which detracts from the yield and increases the cost.

Thus, it would be beneficial to have a system and method for increasing the wiring channels/density under dense via fields of a circuit board without increasing the cost of the printed circuit board.

SUMMARY OF THE INVENTION

The present invention provides a system and method for increasing the wiring channels/density under dense via fields of a circuit board. With the system and method of the present invention, a channel of power/ground lines is identified with the power/ground line surface pads and associated plated through holes or vias identified as candidates for removal of the plated through holes or vias beneath the surface pads. In an exemplary embodiment, the power/ground lines for the circuit board whose vias are removed are designed to be provided in an orthogonal or diagonal pattern in order to provide channel through which additional signal lines may be routed. Thus, with these power/ground lines, contact is provided only with a surface pad (no vias are present under these surface pads). Therefore, the land grid array (LGA)/ball grid array (BGA) makes contact only on the surface pads of the printed circuit board instead of through vias underneath these surface pads. This opens up wiring channels, which previously used to be occupied by plated through holes and antipads, which can now be used for maximizing signal line wiring.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 7 is an exemplary block diagram illustrating a system for designing the power/ground and signal wiring routing of a printed circuit board in accordance with an exemplary embodiment of the present invention; and FIG. 8 is a flowchart outlining an exemplary operation of the present invention.

DETAILED DESCRIPTION OF THE PREFERRED EMBODIMENT

Figure 1:
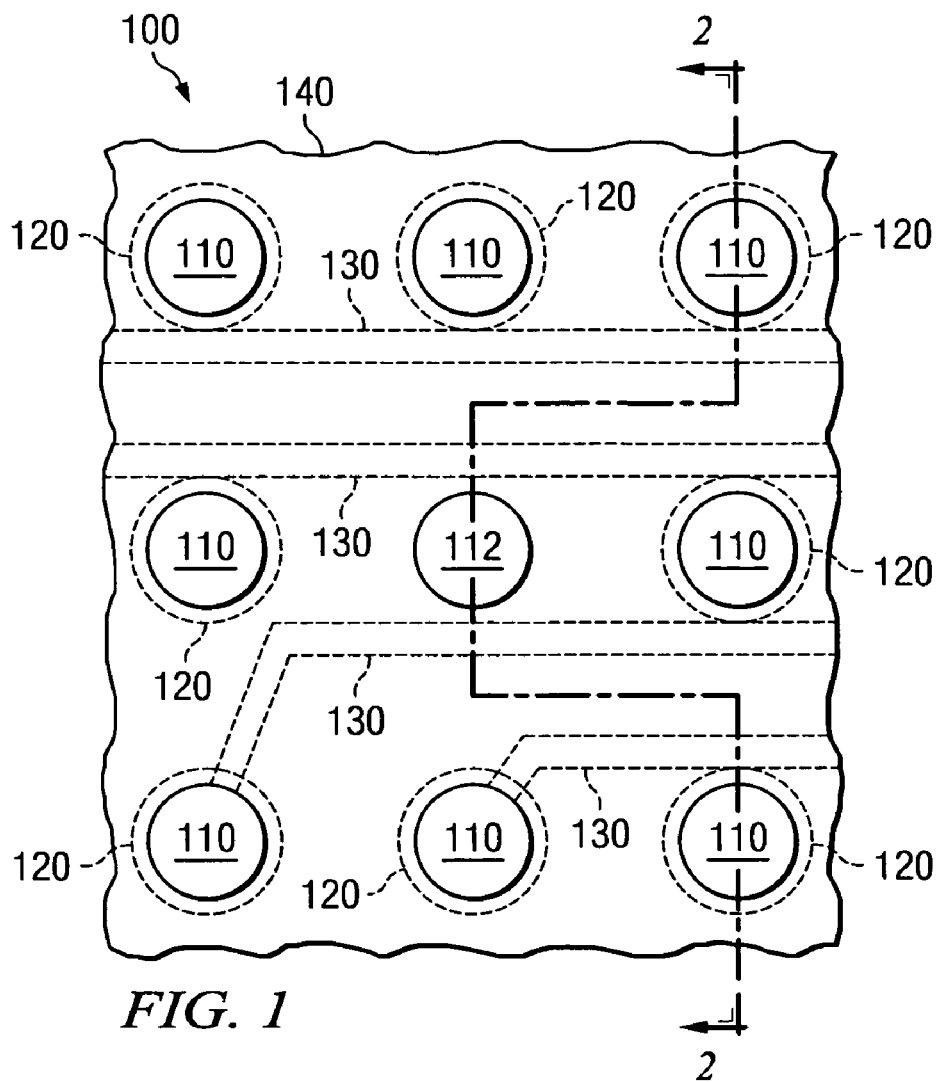
FIG. 1 is an exemplary top view of a portion of an area array of a circuit board in accordance with a known structure.

FIG. 1 is an exemplary top view of a portion of an area array of a circuit board in accordance with a known structure. As shown in FIG. 1, the area array 100 includes a plurality of surface pads 110, anti-pads 120, and signal wires 130. The anti-pads 120 isolate the plated through holes, or vias, under the surface pads 110 from the power/ground wirings on respective ones of the planes of the printed circuit board. As shown in FIG. 1, the plated through holes under all of the surface pads 110 except surface pad 112 have anti-pads 120 that isolate them from the power/ground wirings on plane 140. The power/ground wiring on the plane 140 is coupled to the plated through hole under surface pad 112.

Figure 2:
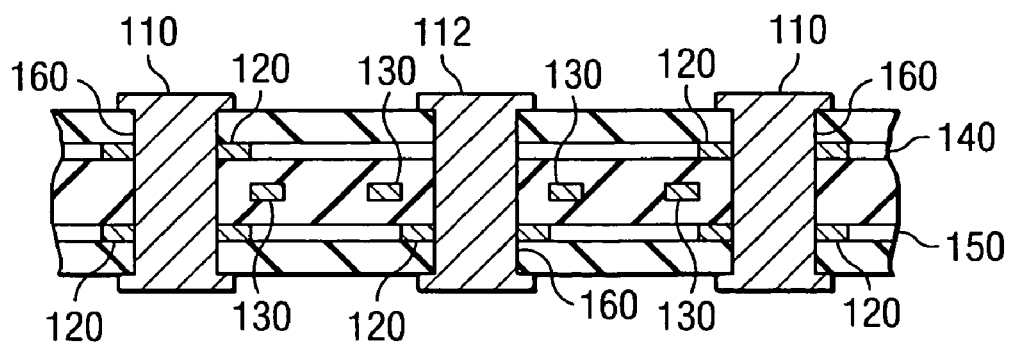
FIG. 2 is a cross-sectional view of the portion of the area array of the circuit board shown in FIG. 1.

FIG. 2 is a cross-sectional view of the portion of the area array of the circuit board shown in FIG. 1. As shown in FIG. 2, under each surface pad 110 is a plated through hole 160 that passes through layers/planes 140 and 150 of the printed circuit board. Although FIG. 2 only shows two layers/planes for simplicity, any number of layers/planes may be used without departing from the spirit and scope of the present invention. Around the plated through holes 160, depending upon the particular power design of the circuit board, anti-pads 120 are provided for isolating the plated through holes 160 from the power/ground wirings of the planes 140 and 150. Signal wires 130 are provided between planes 140 and 150.

The plated through holes 160 and the anti-pads 120 take up additional area of the circuit board layers such that the area available for signal wires 130 is reduced. That is, if the plated through holes 160 and anti-pads 120 were not necessary for the proper functioning of the circuit board, additional signal wires 130 could be provided in the area currently taken up by these structures. The present invention makes use of this observation in an effort to increase wiring channels and wiring density in circuit boards without increasing the cost of the circuit board. The present invention seeks to eliminate the plated through holes and anti-pads where appropriate so that additional area is made available for additional signal wires, thereby increasing the number of signal wire channels and wiring density of the circuit board.

In one exemplary embodiment of the present invention, a channel of power/ground lines of the circuit board whose plated through holes or vias may be removed is identified. In an exemplary embodiment, a set of power/ground line surface pads arranged in an orthogonal or diagonal manner is identified for removal of the plated through holes or vias beneath these surface pads. Those surface pads of the area array that are assigned to power/ground lines whose vias may be removed, are provided as surface pads only. As a result, the area under these surface pads is freed for use in routing additional signal wires. The removal of plated through holes cannot be done for those surface pads assigned to signal lines because signal lines require a plated through hole in order for the signals to be passed from one layer to the other. Removing the plated through holes for signal lines may cause the circuit to not function properly.

The removal of plated through holes or vias associated with surface pads of power/ground lines may be performed for power/ground lines which have redundant power/ground lines elsewhere in the circuit board. That is, since the power/ground lines whose plated through holes or vias are removed exist only as surface pads, they do not provide any power/ground connection in themselves. Rather, the power/ground connection is obtained through other power/ground line surface pads whose vias or plated through holes have not been removed. Alternatively, additional power/ground lines may be routed on a top or bottom surface, whichever is necessary, in order to connect the surface pad only power/ground line connections to other power/ground line connections whose vias or plated through holes have not been removed by operation of the present invention.

Thus, while the present invention provides a mechanism for freeing area in the printed circuit board for routing of additional signal lines, this freeing of area is at the expense of some penalty in the power/ground delivery. In the case where the surface pad only power/ground lines are connected, on a top or bottom surface of the circuit board, to other power/ground lines existing as surface pads and plated through holes/vias, the additional signal line area is obtained but the reinforcement or robustness of the power/ground connections is reduced.

Figure 3:
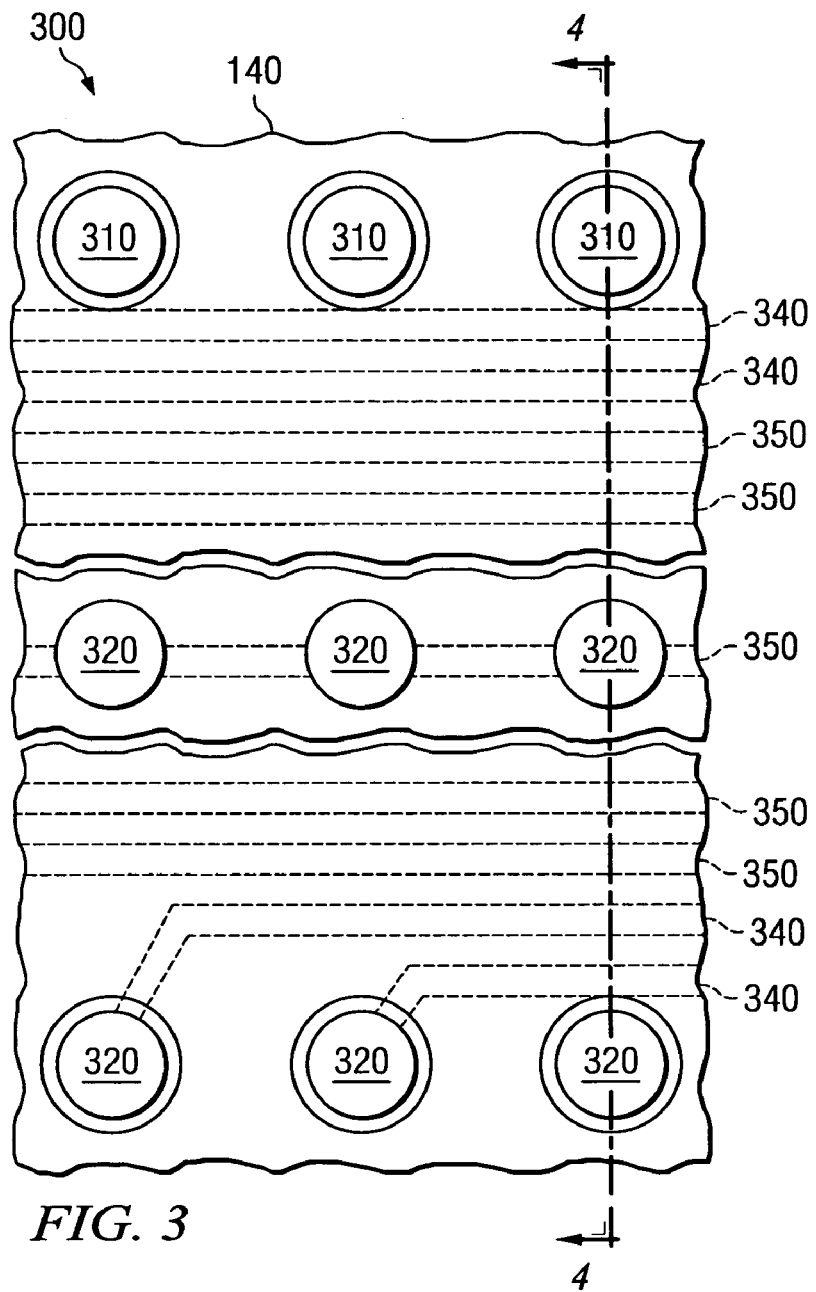
FIG. 3 is an exemplary top view of a portion of an area array of a circuit board in accordance with an exemplary embodiment of the present invention.

FIG. 3 is an exemplary top view of a portion of an area array of a circuit board in accordance with an exemplary embodiment of the present invention. As shown in FIG. 3, the area array 300 includes a plurality of surface pads 310-320. The surface pads 320 are assigned for use as power/ground line surface pads and are part of a channel of power/ground line surface pads whose plated through holes or vias have been determined to be removable in accordance with the present invention. As such, these surface pads 320 exist only as surface pads and do not have any plated through holes beneath them running through the layers and planes of the circuit board. The other surface pads 310 are not assigned to power/ground lines, or are assigned to power/ground lines that are to continue to have their plated through holes beneath their surface pads, and thus, have associated plated through holes. Anti-pads 330 may be provided around the plated through holes in a similar manner as discussed above with regard to FIGS. 1 and 2.

Signal wires 340 may be provided in a similar manner as discussed above with reference to FIGS. 1 and 2. Because the surface pads 320 do not have plated through holes, additional signal wires 350 may also be provided in layers beneath the surface pads 320 to provide additional signal wire channels and increase the signal wire density of the circuit board.

Figure 4:
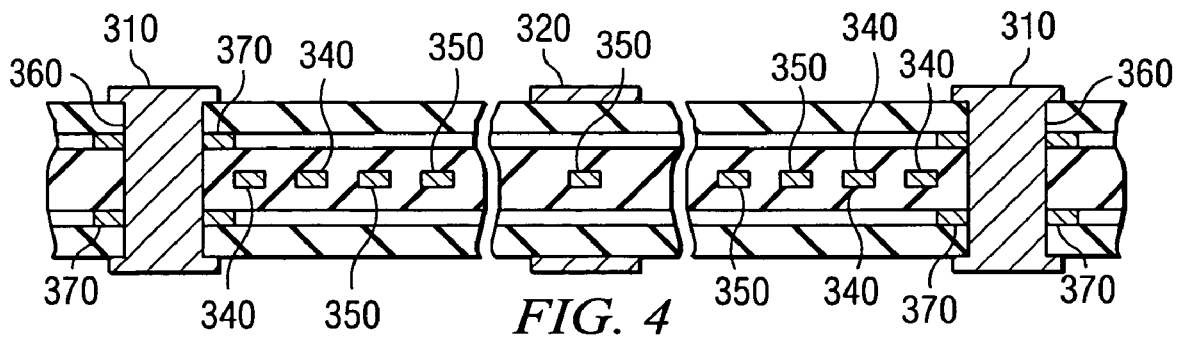
FIG. 4 is an exemplary cross-sectional view of the portion of the area array of the circuit board in accordance with an exemplary embodiment of the present invention.

FIG. 4 is an exemplary cross-sectional view of the portion of the area array of the circuit board in accordance with an exemplary embodiment of the present invention. As shown in FIG. 4, the area under the surface pad 320 does not include any plated through hole or anti-pads. As a result, additional signal lines 350 are permitted to be routed through this area thereby increasing the signal wiring channels and signal wiring density of the circuit board. Other surface pads 310 have corresponding plated through holes 360 and anti-pads 370 in a manner similar to that described above with regard to FIGS. 1 and 2.

The channel of power/ground line surface pads of the area array are arranged in such a manner as to permit optimum removal of plated through holes in the circuit board and routing of additional signal lines to thereby provide additional space for signal wiring on lower layers. Examples of power/ground line arrangements that lead to significantly increased signal wiring density include orthogonal and diagonal channel arrangements. In order to create "open" channels for signal wire routing, the area beneath a series of surface pads from the middle of the circuit board to the edge is freed by use of the present invention. Thus, orthogonal or diagonal arrangements of the pins, from middle to edge, that are to have their plated through hole vias converted to just surface pads, provide the ability to create such "open" channels.

Figure 5:
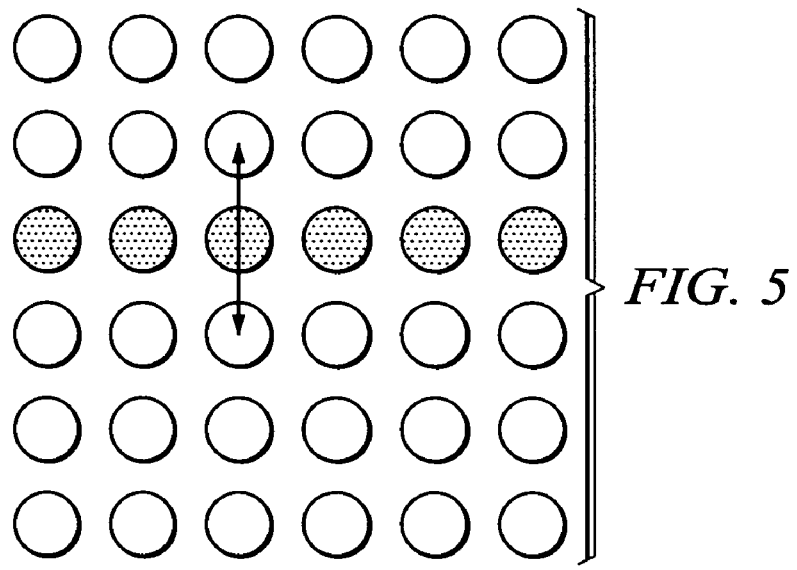
FIG. 5 is an exemplary diagram illustrating an orthogonal arrangement of power/ground wirings in accordance with an exemplary embodiment of the present invention.
Figure 6:
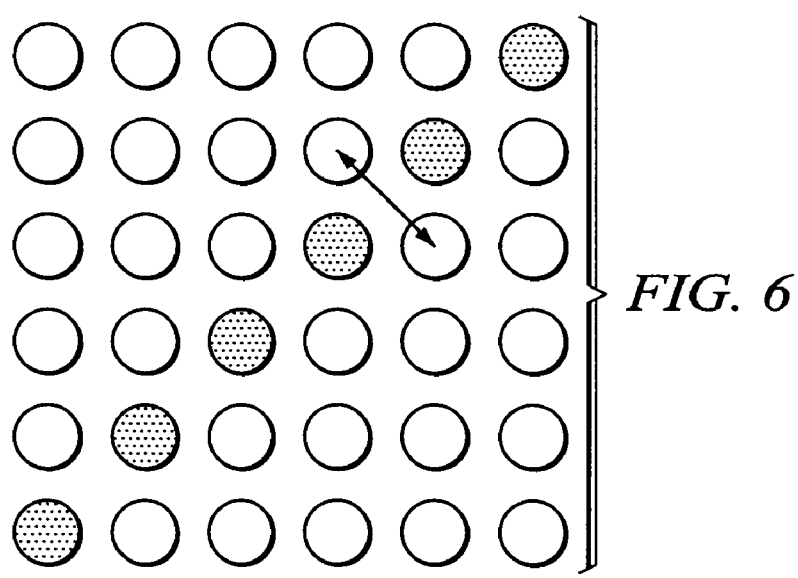
FIG. 6 is an exemplary diagram illustrating a diagonal arrangement of power/ground wirings in accordance with an exemplary embodiment of the present invention.

FIG. 5 is an exemplary diagram illustrating an orthogonal arrangement of power/ground wirings whose plated through holes are to be removed in accordance with an exemplary embodiment of the present invention. FIG. 6 is an exemplary diagram illustrating a diagonal arrangement of power/ground wirings whose plated through holes are to be removed in accordance with an exemplary embodiment of the present invention. The resulting gap, illustrated by the double-headed arrow extending to either side of the channel illustrated by the shaded surface pads shown in FIGS. 5 and 6, is the additional real estate for signal wiring.

Using the orthogonal arrangement of power/ground assigned surface pads, and assuming a spacing between signal lines of 4 mils and a anti-pad diameter of 30 mils, the following improvements in signal wiring densities are achievable:

| | # of lines per layer (w/traditional wiring) | # of lines per layer (w/additional wiring of invention) | % improvement in region |
| --- | --- | --- | --- |
| Wire Width = 4 mil PTH pitch = 50 mil | 6 | 9 | 50% |
| Wire Width = 3 mil PTH pitch = 50 mil | 6 | 10 | 66% |
| Wire Width = 4 mil PTH pitch = 40 mil | 2 | 6 | 200% |
| Wire Width = 4 mil PTH pitch = 40 mil | 4 | 7 | 75% |

Using the diagonal arrangement of power/ground assigned surface pads, and assuming a spacing between signal lines of 4 mils and a anti-pad diameter of 30 mils, the following improvements in signal wiring densities are achievable:

| | # of lines per layer (w/traditional wiring) | # of lines per layer (w/additional wiring of invention) | % improvement in region |
| --- | --- | --- | --- |
| Wire Width = 4 mil PTH pitch = 50 mil | 3 | 9 | 200% |
| Wire Width = 3 mil PTH pitch = 50 mil | 3 | 10 | 233% |
| Wire Width = 4 mil PTH pitch = 40 mil | 1 | 6 | 500% |
| Wire Width = 4 mil PTH pitch = 40 mil | 2 | 7 | 250% |

Thus, by carefully selecting an appropriate power/ground surface pad arrangement for the area array and using only surface pads for these power/ground pad arrangements, a dramatic improvement in the signal wire routings through these areas is achievable. As a result, more signal wire channels are made available for use by the logic present on the circuit board. This increased signal wire channels/density is achieved without increasing the cost of the circuit board since additional layers are not necessary nor are thinner wires that reduce the yield required.

As mentioned above, this removal of plated through holes in the power/ground line design of the circuit board is performed only if there are redundant or other existing power/ground lines that will remain connected to the power/ground layers of the circuit board, i.e. will have their plated through holes remain intact in the power/ground line design. This is because, once the selected power/ground line surface pads/plated through holes are converted to surface pads only, they will no longer provide the power/ground connection they were originally intended to provide. Thus, in order to provide the power/ground connections, redundant power/ground line surface pads and plated through holes connecting these surface pads to power/ground planes in the circuit board are required. If these power/ground line surface pads are properly positioned to provide power/ground connections to the portions of the circuit board where they are required, then no additional lines are necessary.

However, if power/ground connections are required in a portion of the circuit board and these connections were removed by operation of the present invention, additional power/ground lines may be required on one or more of the top and bottom surfaces of the circuit board. These additional power/ground lines may be routed following operation of the present invention during the design of the circuit board and are run between the surface pad only power/ground lines and nearby power/ground lines whose plated through holes have not been removed by operation of the present invention.

FIG. 7 is an exemplary block diagram illustrating a system for designing the power/ground and signal wiring routing of a printed circuit board in accordance with an exemplary embodiment of the present invention. As shown in FIG. 7, the system includes a circuit board design engine 710, a design analysis engine 720, a power/ground design engine 730, a signal wire optimization engine 740, and a circuit board fabrication engine 750. The elements 710-750 may be implemented as hardware, software, or any combination of hardware and software without departing from the spirit and scope of the present invention. In one exemplary embodiment of the present invention, the elements 710-750 are implemented as software instructions executed by one or more data processing devices.

The circuit board design engine 710 provides a mechanism through which an initial circuit board design is generated by a user, an automated or semi-automated system, or the like. The initial circuit board design 710 is provided to the design analysis engine 720 which analyzes the circuit board design to identify the area array arrangement for the circuit board design. Based on this analysis, the power/ground design engine 730 applies a suitable power/ground arrangement for the surface pads of the area array. That is, certain surface pads of the area array are assigned for use by power/ground lines. Some of the surface pads assigned for use by power/ground lines are to be formed as surface pads only while others are formed as surface pads and plated through holes in a normal fashion. The particular power/ground lines that are to exist as surface pads only may be determined according to the power/ground arrangement in order to provide a channel through which additional signal lines may be routed. The power/ground arrangement may be user defined or may be automatically determined according to power/ground design criteria established in the power/ground design engine 730. In an exemplary embodiment, the arrangement of power/ground lines that are to exist as surface pads only are arranged in a orthogonal or diagonal manner so as to provide a channel from a center of the circuit board to an edge of the circuit board.

As mentioned above, in cases where the removal of plated through holes beneath surface pads of power/ground lines results in power/ground connections not be provided to areas of the circuit board where they are needed, additional power/ground lines may be required on a top or bottom surface of the circuit board. Therefore, the power/ground design engine 730 may evaluate the design layout to determine if all areas of the circuit board are provided with sufficient power/ground connections. If not, then a surface pad only power/ground line may be connected to a nearby power/ground line, whose plated through hole has not been removed, by way of an additional power/ground line on the surface of the circuit board. As a result, additional area is made available in lower layers of the circuit board for additional signal wire routings beneath the power/ground surface pads without eliminating required power/ground connections.

The signal wire optimization engine 740 takes advantage of this additional area to redesign the signal wire routings to optimize the signal wire routing based on the additional area that is made available. The resulting optimized signal wire routings may be fed back into the circuit board design engine 710 to further modify the circuit board design to take full advantage of the additional signal wire routings. The resulting optimized circuit board design is then provided to the circuit board fabrication engine 750 which is used, along with circuit board fabrication machinery, to fabricate the circuit board in accordance with the optimized circuit board design.

FIG. 8 is a flowchart outlining an exemplary operation of the present invention. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 8, the operation starts by receiving an initial circuit board design (step 810). The initial circuit board design is analyzed to determine the surface pad configuration for the circuit board design (step 820). A power/ground design is then applied to the surface pad configuration to thereby assign certain ones of the surface pads to power/ground lines (step 830). The circuit board design is then modified such that certain ones of the surface pads assigned to power/ground lines are represented as surface pads only with no plated through holes or anti-pads beneath them (step 840). As a result, additional area is provided for signal wire routings.

The signal wire routings are then optimized based on this additional area such that additional signal wires are made available through this freed area (step 850). The circuit board design is then optimized based on these additional signal wire channels (step 860). The optimized circuit board design is then utilized to fabricate the circuit board (step 870) and the operation terminates.

Thus, the present invention provides a mechanism for increasing the available area for signal wire routings in a circuit board design without increasing the number of layers necessary for the circuit board or using thinner wires that reduce the yield. As a result, a higher signal wire density and large number of signal wire channels are made available without increasing the overall cost of the circuit board. These advantages are made available by assigning surface pads of the area array to power/ground lines in accordance with a suitable power/ground surface array arrangement and then generating these assigned surface pads as surface pads only without plated through holes beneath them. The resulting freed area beneath these assigned surface pads may then be used to route signal wires thereby increasing the density of the signal wires and increasing the number of signal wire channels.

It is important to note that while aspects of the present invention have been described in the context of a fully functioning data processing system, those of ordinary skill in the art will appreciate that processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for fabricating a circuit board, comprising:
   receiving an initial circuit board design;
   creating a pattern of surface pads associated with power/ground lines whose vias are to be removed;
   removing vias, associated with the pattern of surface pads, in the initial circuit board design;

optimizing signal wire routings to utilize space freed by the removal of the vias associated with the pattern of surface pads, thereby generating an optimized circuit board design; and fabricating the circuit board based on the optimized circuit board design.

2. The method of claim 1, wherein additional signal wire routings are provided through an area beneath the pattern of surface pads where the vias would have been.

3. The method of claim 1, wherein creating a pattern of surface pads includes:

analyzing the initial circuit board design to identify a plurality of surface pads associated with power/ground lines; and applying a power/ground surface pad arrangement to thereby assign a subset of surface pads from the plurality of surface pads to surface pad only power/ground lines.

4. The method of claim 1, wherein the pattern of surface pads are associated with a series of surface pads arranged in an orthogonal direction from a middle of the circuit board to an edge of the circuit board.

5. The method of claim 1, wherein the pattern of surface pads are associated with a series of surface pads arranged in a diagonal direction from a middle of the circuit board to an edge of the circuit board.

6. The method of claim 3, wherein the power/ground surface pad arrangement is one of an orthogonal series of surface pads extending from a middle of the circuit board to an edge of the circuit board or a diagonal series of surface pads extending from the middle of the circuit board to the edge of the circuit board.

7. The method of claim 1, wherein the pattern of surface pads are a series of surface pads arranged such that signal wires may run beneath the series of surface pads from a center to an edge of the circuit board.

* * * * *